(12) United States Patent
Peterson et al.

(10) Patent No.: US 9,719,173 B2
(45) Date of Patent: Aug. 1, 2017

(54) COATING FOR CUTTING IMPLEMENTS (75) Inventors: Michael E. Peterson, Fairfield, CT (US); Larry Buchtmann, Goldsboro, NC (US)

(73) Assignee: Acme United Corporation, Fairfield, CT (US)

( * ) Notice: Subject to any disclaimer, the term of this patent is extended or adjusted under 35 U.S.C. 154(b) by 958 days.

(21) Appl. No.: 12/562,538

(22) Filed: Sep. 18, 2009

(65) Prior Publication Data

US 2010/0071217 A1  Mar. 25, 2010

Related U.S. Application Data (60) Provisional application No. 61/098,402, filed on Sep. 19, 2008.

(51) Int. Cl.
*C23C 28/00* (2006.01)
*C23C 14/06* (2006.01)
*C23C 30/00* (2006.01)

(52) U.S. Cl.
CPC .......... *C23C 28/00* (2013.01); *C23C 14/0635* (2013.01); *C23C 14/0641* (2013.01); *C23C 14/0664* (2013.01); *C23C 30/00* (2013.01); *Y10T 428/31663* (2015.04)

(58) Field of Classification Search
CPC ....... C23C 28/30; C23C 18/122; C23C 20/00; C23C 20/02; C23C 20/04; C23C 20/06; C23C 14/0635; C23C 14/0664
USPC .......................................................... 30/350
See application file for complete search history.

(56) References Cited

U.S. PATENT DOCUMENTS

| | | | |
|---|---|---|---|
| 2,937,976 A | | 5/1960 | Granahan et al. |
| 3,220,031 A | * | 11/1965 | Supernor ...................... 408/141 |
| 3,457,323 A | * | 7/1969 | Stengle, Jr. ................... 525/431 |
| 3,635,811 A | | 1/1972 | Lane |
| 3,774,703 A | | 11/1973 | Sanderson |
| 3,802,078 A | * | 4/1974 | Denes ............................. 30/350 |
| 3,931,084 A | * | 1/1976 | Buckley .............. C09D 127/12 |
| | | | 524/380 |
| 4,101,703 A | * | 7/1978 | Schintlmeister .............. 428/552 |
| 4,717,632 A | * | 1/1988 | Keem et al. .................. 428/698 |
| 5,069,872 A | * | 12/1991 | Penoza ......................... 420/436 |
| 5,204,191 A | * | 4/1993 | Dubois ................... C22C 45/08 |
| | | | 126/390.1 |

(Continued)

FOREIGN PATENT DOCUMENTS

| | | | |
|---|---|---|---|
| EP | 2052789 | * | 4/2009 |
| GB | 1342072 | | 12/1973 |

(Continued)

OTHER PUBLICATIONS

International Preliminary Report on Patentability for International Application No. PCT/US2009/057474 dated Mar. 31, 2011.

*Primary Examiner* — Jennifer Swinney
(74) *Attorney, Agent, or Firm* — Alix, Yale & Ristas, LLP (57) ABSTRACT

Coated cutting implements having increased longevity, corrosion and stain resistance, a smooth and uniform appearance and color, and/or reduced friction between cutting blades are provided. The coatings on the cutting implements have at least two layers. The first layer is a metal-based layer that imparts hardness or wear-resistance to the cutting implement. The second layer is comprised of an organic polymer.

16 Claims, 3 Drawing Sheets

(56) References Cited

U.S. PATENT DOCUMENTS

| | | | |
|---|---|---|---|
| 5,488,774 A * | 2/1996 | Janowski | 30/346.53 |
| 6,238,449 B1 | 5/2001 | Woo et al. | |
| 6,312,484 B1 | 11/2001 | Chou et al. | |
| 6,440,150 B1 * | 8/2002 | Hipp et al. | 606/174 |
| 6,827,975 B2 * | 12/2004 | Leverenz et al. | 427/249.1 |
| 6,929,865 B2 * | 8/2005 | Myrick | 428/469 |
| 6,988,318 B2 * | 1/2006 | Buchtmann et al. | 30/350 |
| 7,939,172 B2 * | 5/2011 | Gorokhovsky et al. | 428/408 |
| 2002/0150778 A1 * | 10/2002 | Leech | A47J 36/02 428/474.4 |
| 2003/0232201 A1 * | 12/2003 | Byrd et al. | 428/447 |
| 2004/0019143 A1 * | 1/2004 | Koloski | C08F 283/00 524/434 |
| 2006/0233955 A1 * | 10/2006 | Smith | C09D 5/002 427/299 |
| 2007/0099014 A1 * | 5/2007 | McCullough et al. | 428/469 |
| 2007/0214661 A1 * | 9/2007 | Peterson et al. | 30/451 |
| 2008/0261058 A1 * | 10/2008 | Layyous et al. | 428/450 |
| 2009/0263668 A1 * | 10/2009 | David et al. | 428/447 |

FOREIGN PATENT DOCUMENTS

| | | |
|---|---|---|
| WO | WO 92/17323 | 10/1992 |
| WO | WO 2007/035807 | 3/2007 |

* cited by examiner

COATING FOR CUTTING IMPLEMENTS

CROSS-REFERENCE TO RELATED APPLICATIONS

This application claims the benefit of U.S. provisional application Ser. No. 61/098,402 filed on Sep. 19, 2008, the entire disclosure of which is incorporated herein by reference.

FIELD OF THE INVENTION

The present invention is related to cutting implements, including single blade and complementary blade cutting implements such as knives, helical blade cutters, scissors, shears, guillotine style paper trimmers, and rotary style paper trimmers. More particularly, the present invention is related to a coating for such cutting implements.

BACKGROUND

Substantial effort has been expended in improving the construction and operation of cutting implements for household, industrial, kitchen, craft, sport and office use. Ever increasing demands have been placed on manufacturers of these products to increase the ease of use, the wear resistance, and the ease with which the products can be cleaned, while maintaining a competitive price. For example, typical household and office scissors have been unable to achieve a long-lasting cutting edge, which withstands the wide-variety of products being cut, at a competitive price. Consequently, continued improvements in cutting implements is desired.

BRIEF SUMMARY

It is an object of the present invention to provide a cutting implement having a coating that provides one or more of improved wear resistance, increased hardness, pleasing appearance, reduced user effort, and increased stain resistance.

In one embodiment, the invention is a cutting implement comprising: at least one cutting blade having a surface and a cutting edge; and a coating disposed on the surface of the cutting blade, the coating having: (a) a first layer in contact with the surface, the first layer comprising nitrides, carbides and/or carbonitrides of a metal selected from the group consisting of titanium, chromium or a combination thereof; and, (b) a second layer, overlaying the first layer, the second layer comprising a polymer that is free of, or substantially free of, fluoride.

The above-described and other features and advantages of the present invention will be appreciated and understood by those skilled in the art from the following detailed description, drawings, and appended claims.

DETAILED DESCRIPTION OF THE PREFERRED EMBODIMENT

One aspect of the present invention provides coatings that can provide the blades and/or cutting edges of a cutting implement with tough, hard, wear resistant characteristics, as well as non-stick properties. Based in part upon these characteristics, a coated implement can have substantially increased longevity, corrosion and stain resistance, a smooth and uniform appearance and color, and/or reduced friction between cutting blades during use. The coatings have at least two layers. The first layer is a metal-based layer that imparts hardness or wear-resistance to the cutting implement. The second layer is comprised of an inorganic or organic polymer that may impart non-stick properties to the cutting implement.

First Layer:

The first layer of the coating comprises metal compounds based on titanium or chromium or both. Depending on the coating method used, and the process conditions employed, the metal compounds may be nitrides, carbides and/or carbonitrides. For example, when the coating is formed via physical vapor deposition (PVD) under a nitrogen atmosphere, the metal compounds will be nitrides such as titanium nitride (TiN), chromium nitride (CrN), and/or mixed metal species, such as titanium chromium nitride (TiCrN). If both titanium and chromium are applied as a coating under a nitrogen atmosphere a number of mixed species compounds, such as titanium chromium nitride (TiCrN), may also be produced along with the TiN and CrN.

Alternatively, if a carbon source is used to prepare the first layer of the coating, the metal compounds will include carbides including titanium carbide (TiC), chromium carbide (CrC), and/or mixed metal species such as titanium chromium carbide (TiCrC). If both nitrogen and carbon sources are used to prepare the coating, then carbonitride compounds, including titanium carbonitride (TiCN), chromium carbonitride (CrCN), and titanium chromium carbonitride (TiCrCN), can also be formed.

CrC is an extremely hard material, similar to tungsten carbide. CrC can be classified as a refractory and a ceramic. TiC is an extremely hard material, similar to tungsten carbide. Like CrC, TiC can be classified as a refractory and a ceramic.

Unless otherwise stated, mixed specie metal compounds will be considered as 50:50 weight ratio of the non-mixed specie compounds when calculating the weight ratio of titanium and chromium species in the specification and the claims. In other words, for convenience, any TiCrN present would be considered a 50:50 blend of TiN:CrN. For example, a composition consisting of 42 g TiN, 42 g CrN and 8 g TiCrN will be considered herein to be a 50:50 weight ratio of TiN:CrN.

The first layer of the coating is desirably disposed on one or more blades of a cutting implement such that the coating forms a metallurgical bond with the blades, which resists flaking, blistering, chipping, and peeling. In some embodiments, the coating can be absorbed into the surface layer of the metal of blades of a cutting implement. The first layer desirably bonds to a variety of non-stick layers, including layers containing one or more of silanes, alkoxids, alkanes, alkyds and oxalkyds.

The ratios of the chromium-containing compounds to the titanium-containing compounds in the first layer of the coatings can vary over a significant range. For example, in some embodiments, the first layer of the coating comprises titanium carbides, titanium nitrides and/or titanium carbonitrides in amounts of about 20 to about 80 weight percent (wt. %) and chromium carbides, chromium nitrides and/or chromium carbonitrides in amounts of about 20 to about 80 wt. %. This includes coatings in which the first layer comprises titanium carbides, titanium nitrides and/or titanium carbonitrides in amounts of about 20 to about 50 wt. % and chromium carbides, chromium nitrides and/or chromium carbonitrides in amounts of about 50 to 80 wt. %. For example, some embodiments of the coatings include a first layer that comprises titanium carbides, titanium nitrides and/or titanium carbonitrides in amounts of about 20 to about 40 wt. % and chromium carbides, chromium nitrides and/or chromium carbonitrides in amounts of about 50 to 70 wt. %.

In embodiments of the first layer composed of a blend of titanium carbides and chromium carbides, the first layer of the coating can include titanium carbides in amounts of about 20 to about 80 weight percent (wt. %) and chromium carbides in amounts of about 20 to about 80 wt. %. This includes coatings in which the first layer comprises titanium carbides in amounts of about 20 to about 50 wt. % and chromium carbides in amounts of about 50 to 80 wt. %. For example, some embodiments of the coatings include a first layer that comprises titanium carbides in amounts of about 20 to about 40 wt. % and chromium carbides in amounts of about 50 to about 70 wt. %.

Using a blend of titanium carbides and chromium carbides in the first layer can be advantageous because some polymers can have a stronger affinity for the carbon atoms in a carbide coating, relative to a nitride coating, which would provide stronger adherence between the coating layers. As such, the second layer of the coatings can bond more strongly to the first layer that it would to an uncoated steel or stainless steel substrate.

In one particular embodiment, the first layer of the coating comprises about 30 wt. % titanium carbide, titanium nitride and/or titanium carbonitride and about 70 wt. % chromium carbide, chromium nitride and/or titanium carbonitride. For example, the first layer can comprise about 30 wt. % titanium carbide and about 70 wt. % chromium carbide.

In another embodiment, the first layer of the coating comprises about 50 wt. % titanium carbide, titanium nitride and/or titanium carbonitride and about 50 wt. % chromium carbide, chromium nitride and/or titanium carbonitride. For example, the first layer can comprise about 50 wt. % titanium carbide and about 50 wt. % chromium carbide.

Second Layer:

The second layer of the present coatings comprises a polymer that can provide non-stick and/or corrosion resistant characteristics to a cutting blade surface. The polymer can be an inorganic (e.g., ceramic) or organic polymer and, in some embodiments, the polymer is substantially free, or completely free, of fluoride groups or substituents. An organic polymer typically contains carbon and hydrogen and is noncrystalline. Suitable fluoride-free polymers may be silicon based, for example, polysiloxanes, silicones (e.g., silicone elastomers), silanes, oxalkyds, alkhydroxedes, or silicas, including amorphous silicas, such as taught in U.S. Pat. Nos. 5,549,604; 6,228,921; 6,599,635; and US Pub. App. US2006/0259033, the entire disclosures of which are incorporated herein by reference. In one exemplary embodiment, the second layer comprises a polyether sulfone.

Other embodiments of the coatings may use a fluoride-based polymer (fluoropolymers) as the non-stick material. Such fluoride compounds are well-known and include PTFE (polytetrafluoroethylene), PFA (perfluoroalkoxy) polymer resin, or FEP (fluorinated ethylene-propylene copolymer). PTFE non-stick coatings can be manufactured, for example, by a liquid coating applied directly to the surface of the first layer of the coating; sometimes two or three layers of polymer are applied. Using this method, the first layer of the coating is baked in a high-temperature oven to remove the liquid and to ensure that the coating adheres to the surface. The finished coating is a dried, durable non-stick material. Other similar materials and processes are commonly used, as taught in U.S. Pat. No. 7,261,925, the entire disclosure of which is incorporated herein by reference.

In some embodiments, the polymer is a sol-gel coating. The sol-gel process is a well-known wet-chemical technique for the fabrication of materials (typically a metal oxide) starting either from a chemical solution (sol short for solution) or colloidal particles (sol for nanoscale particle) to produce an integrated network (gel). Typical precursors are metal alkoxides and metal chlorides, which undergo hydrolysis and polycondensation reactions to form a colloid, a system composed of solid particles (size ranging from 1 nm to 1 μm) dispersed in a solvent. The sol evolves then towards the formation of an inorganic continuous network containing a liquid phase (gel). Formation of a metal oxide involves connecting the metal centers with oxo (M-O-M) or hydroxo (M-OH-M) bridges, therefore generating metal-oxo or metal-hydroxo polymers in solution. The drying process serves to remove the liquid phase from the gel thus forming a porous material, then a thermal treatment (firing) may be performed in order to favor further polycondensation and enhance mechanical properties. U.S. Pat. Nos. 6,599,635 and 6,228,921 provide good descriptions of sol-gel processes that are useful for the current invention. Such non-stick ceramic coatings are known in the art, for example, U.S. Pat. No. 7,217,907; US 2004/0253432; and WO 2006/096127, all of which are hereby incorporated by reference in their entirety.

Coating Properties:

The first layer of the present coatings can be characterized by their hardness, including Vickers (VPN) hardness and nanoindentation hardness, and by their wear resistance, while the second layer of the coatings can be characterized by their scratch adhesion.

In some embodiments of the coatings, the first layer has a Vickers hardness of at least 3.5 GPa. This includes embodiments in which the first layer has a Vickers hardness of at least Vickers hardness of at least 4.0 MPa and further includes embodiments in which the first layer has a Vickers hardness of at least 4.5 MPa. For the purposes of this disclosure, Vickers hardness is measured according to ASTM standard E384 (03.01). More information regarding the measurement of Vickers hardness is provided in the Examples, below. In some embodiments, the first layer of the coating has a hardness not less than eight times that of the uncoated cutting blade.

In some embodiments of the coatings, the first layer has a nanoindentation hardness of at least about 8 GPa. This includes embodiments in which the first layer has a nanoindentation hardness of at least 10 GPa, further includes embodiments in which the first layer has a nanoindentation hardness of at least 12 GPa, still further includes embodiments in which the first layer has a nanoindentation hardness of at least 20 GPa, and also includes embodiments in which the first layer has a nanoindentatin hardness of at least 25 GPa. For the purposes of this disclosure, the nanoindentation hardness is measured according to the methods described in the Examples, below.

In some embodiments of the coatings, the first layer has a wear resistance (wear rate) of no greater than 100 $micron^3$/minute. This includes embodiments in which the first layer has a wear resistance of no greater than about 70 $micron^3$/minute and further includes embodiments in which the first layer has a wear resistance of no greater than about 30 $micron^3$/minute. For the purposes of this disclosure, wear resistance is measured according to ASTM G99-95a. More information regarding the measurement of wear resistance is provided in the Examples, below.

In some embodiments of the coatings, the second layer has a scratch adhesion of at least 0.6 MPa. This includes embodiments in which the second layer has a scratch adhesion of at least 0.7 MPa, further includes embodiments in which the second layer has a scratch adhesion of at least 0.8 MPa, and still further includes embodiments in which the second layer has a scratch adhesion of at least 0.9 MPa. For the purposes of this disclosure, scratch adhesion is measured according to ASTM D7027-05 and ASTM C1624. More information regarding the measurement of scratch adhesion is provided in the Examples, below.

Color:

The present coatings can be tailored to provide a cutting implement, such as scissors, with an aesthetically acceptable color or appearance. Specifically, the coating can differentiate cutting blades having a coating from uncoated blades. However, the coating need not change the color of the blades to the point that the consumer no longer recognizes coated scissors as being useable for general household and office use. Depending upon the nature and relative amounts of the components in the first and second layers of the coatings, some embodiments of the coatings can be silver, grey or charcoal in appearance.

The color of the titanium and/or chromium-based coating depends on the particular chemical species present. Titanium nitride can have a gold—bronze color, chromium nitride can have a silver color, titanium carbide can be grey—charcoal and chromium carbide can be silver. Heavier film builds make titanium nitride or titanium carbide darker but chromium nitride and chromium carbide color are less sensitive to thickness. Excess carbon source gas in the PVD chamber and the addition of other metals can make a carbide darker.

Thickness:

The coatings can be deposed on a cutting blade substrate with a pre-defined target coating thickness. For example, the coating thickness can have a target range of about 0.05 microns to about 1.0 microns. For example, the coating can have a thickness range from about 0.1 to about 0.6 microns. In some embodiments, the coating can have a target thickness range of about 0.3 microns to about 0.5 microns. It is contemplated that the target thickness range can vary, for example, from about +/−0.02 microns to about +/−0.15 microns, depending upon the target thickness, and still be within an acceptable range of deviation. By example, with a target thickness of 0.5 microns the standard deviation can be +/−0.1 microns.

The coating can cover the entire blade surface, as in the case where the cutting edge is formed prior to the coating process. In an alternative embodiment, a bevel on the blade is not covered by the coating, as in the case where the bevel is formed after the coating process has occurred. In this embodiment, the cutting edge remains coated when the bevel is created after the blade has undergone a coating process. The bevel can be created by a metal cutting or etching process.

Figure 1:
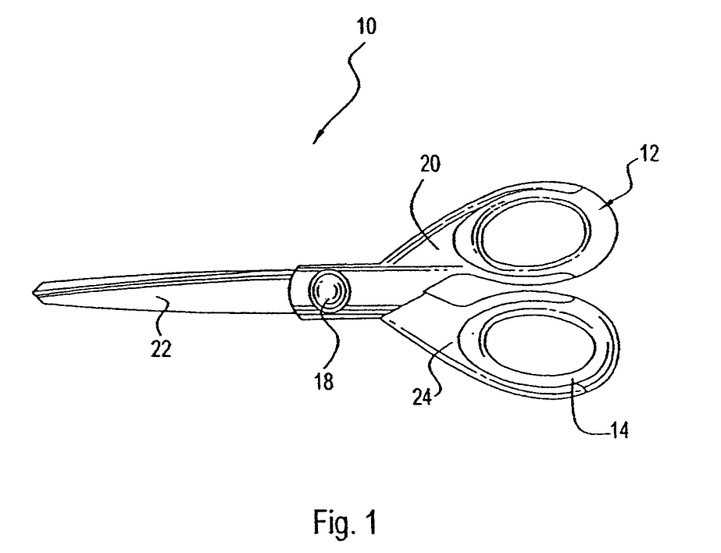
FIG. 1 is a first side view of an exemplary embodiment of a pair of scissors.
Figure 2:
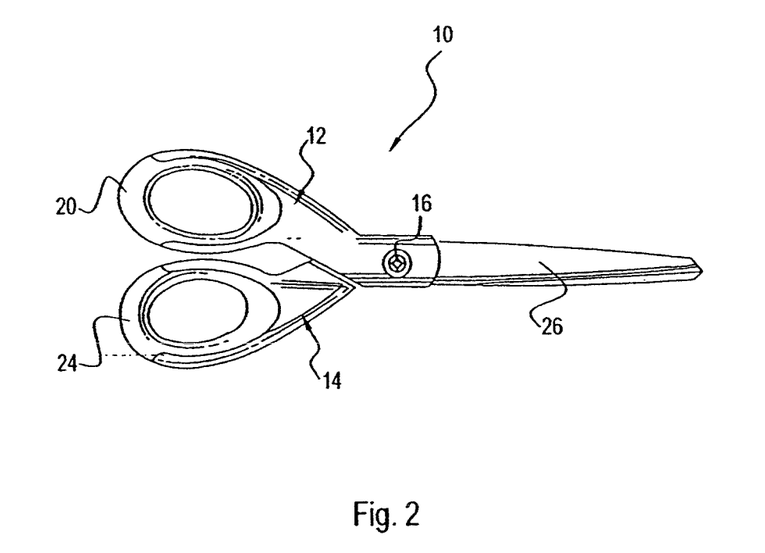
FIG. 2 is a second, opposite side view of FIG. 1.

Cutting Implements:

Although the present coatings can be applied to a variety of cutting implements, for purposes of illustration, they are described below as a coating on a pair of scissors. Generally, the present coatings are useful for substrates comprising various metals, such as heat-treated steels, heat-treated stainless steels, and heat-treated 420 stainless steel. Referring now to the figures and in particular to FIGS. 1 and 2, a cutting implement in the form of pair of scissors generally indicated by reference numeral 10 is illustrated.

Figure 3:
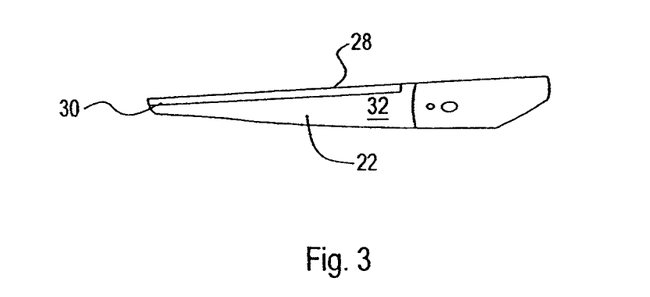
FIGS. 3 and 4 are side views of the blades of the scissors of FIG. 1.
Figure 4:
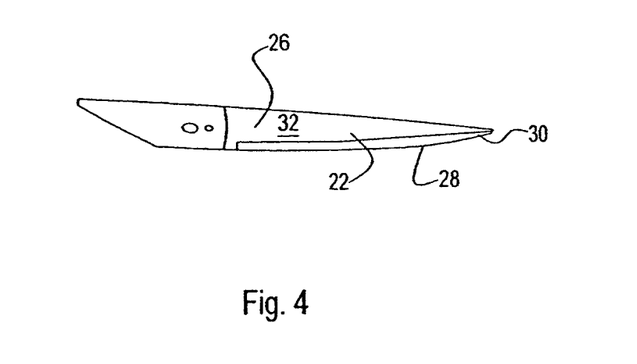
Figure 5:
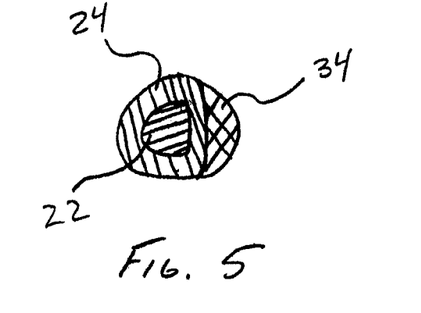
FIG. 5 is a cross-section of the blade of FIG. 1.

Scissors 10 have a first half 12 pivotally connected to a second half 14. First and second halves 12, 14 are pivotally connected by conventional connection means, such as a screw 16 and a post 18. First half 12 can have a handle 20 and a blade 22. Similarly, second half 14 can have a handle 24 and a blade 26. Each blade 22, 26 has a cutting edge 28. Preferably, cutting edge 28 is formed by way of a bevel 30 disposed on each blade 22, 26. Thus, scissors 10 provide a pair of complementary cutting blades 22, 26 for cutting products, such as paper, cardboard, Bristol board, and others. Handles 20, 24 are preferably overmolded onto blades 22, 26. However, it should be recognized that each half 12, 14 of scissors 10 is described as having separate handles 20, 24 overmolded onto blades 22, 26. It is contemplated by the present invention that each half 12, 14 have a unitary handle and blade portion. Blade 22 is illustrated in FIG. 3, while blade 26 is illustrated in FIG. 4. Blades 22, 26 are preferably made of steel, more preferably stainless steel, such as 420 stainless steel. In addition, blades 22, 26 can be heat-treated to further increase the hardness of the blades. Referring to FIG. 5, a cross-section of blade 22 is shown. As shown in the figure, the coating 32 is disposed on the surface 34 of blade 22.

Coating 32 can provide cutting edges 28 with tough, hard, wear resistant characteristics. The increased hardness of cutting edges 28 can provide scissors 10 with substantially increased longevity, while also providing the scissors with corrosion resistance, as well as providing a smooth and uniform appearance and color. For example, in some embodiments scissors 10 having coating 32 can be subjected to cycle testing of 10,000 openings and closings without showing any signs of wear to the coating.

It should also be recognized that coating 32 has been described above by way of example only as finding use with a cutting implement in the form of scissors 10. Coating 32 can provide the aforementioned benefits to other cutting implements. For example, FIGS. 6 to 9 illustrate alternate exemplary embodiments of cutting implements, which have a coating.

Another exemplary embodiment of a cutting implement is an implement in the form of a rotary style paper trimmer. In one embodiment, a rotary style paper trimmer has a base and a rotary cutting mechanism. The base can have a rail and a cutting blade or anvil. The rotary cutting mechanism has a circular cutting blade disposed in a housing. The housing can be slideably received on the rail. A second blade is disposed in the housing opposite the first blade. The first blade has a cutting edge formed at its outer periphery, while the second blade has a corresponding cutting edge. The rotary cutting mechanism is also movably received on the rail such that the two cutting edges can be moved into contact with one another. Accordingly, trimmer has a pair of complementary cutting blades. In accordance with the present invention, the trimmer can have a coating disposed on blades one or both of its cutting blades. During use of trimmer, a piece of paper is positioned between the two cutting edges. The rotary cutting mechanism is moved such that the first cutting edge is contact with the second cutting edge. Then, the rotary cutting mechanism is slid along the rail such that the interaction of the cutting edges severs the paper disposed therebetween.

Another exemplary embodiment of a cutting implement in an implement in the form of a guillotine style paper trimmer. In one embodiment, such a trimmer has a base and a pivoting cutting mechanism. The base can have a fixed cutting blade.

A pivoting cutting mechanism having a movable cutting blade can be pivotally secured to base at a pivot point. Each blade has a cutting edge. Accordingly, the trimmer has a pair of complementary cutting blades. The cutting blades are preferably made of steel, more preferably stainless steel, such as 420 stainless steel. In addition, cutting blades can be heat-treated to further increase the hardness of the complementary cutting blades. The trimmer can have a coating disposed on one or both of the cutting blades. During use of the trimmer, a piece of paper is positioned on the base so that the portion to be cut is disposed between the cutting edges of the cutting blades. The pivoting cutting mechanism is moved about a pivot point such that the cutting edges shear the paper.

Method of Coating a Cutting Implement:

A basic method for making a coated cutting implement comprises, forming the first layer in contact with at least one surface of the cutting blade, the first layer comprising a composition comprising nitrides, carbides and/or carbonitrides of a metal selected from the group consisting of titanium, chromium or both; and forming the second layer, overlaying the first layer, the second layer The first layer of the coating can be deposited onto the surface of a cutting blade by any suitable thin film forming method, such as cathode arc plasma (CAP) processes, chemical vapor deposition (CVD), physical vapor deposition (PVD), sputtering, thermal spraying and sintering after dip coating. The Examples below illustrate a method of forming the first layer of the coating using PVD. In an alternative embodiment, deposition of the layer can be performed by CAP with the sputtering gas mixture chosen from, for example, the group including argon, nitrogen, methane, acetylene and ammonia. In this process, two different targets can be used that contain chromium and titanium. Preferably, the method of forming coating has a maximum temperature sufficient to not soften or affect the heat-treatment of the uncoated blades.

In some embodiments, the finish surface of blade can be roughened prior to the deposition of the first layer of the coating to improve bonding. The surface roughening may be accomplished by, for example, chemical etching, sanding or grit blasting. A surface roughness between 0.5 to 2 (e.g., from 0.5 to 1) microns can be advantageous.

Because a PVD coating can make a metallurgical bond (in contrast to a physical bonding and plating) penetrating several atoms in depth of the material being coated, creating a stronger attachment to the coated blade, PVD is a preferred method of depositing the first layer of the coating.

In some embodiments, the second layer of the coating is applied over the first layer using a sol-gel technique. The starting materials used in the preparation of the "sol" are usually inorganic metal salts or metal organic compounds such as metal alkoxides. In a typical sol-gel process, the starting materials are subjected to a series of hydrolysis and polymeration reactions to form a colloidal suspension, or a "sol". For example, for a silica sol gel, the hydrolysis induces the organic compounds to link to silicon in silanol Si—OH groups. These chemical species may react together to form Si—O—Si (siloxane) bonds which lead to formation of a silica network. This phase establishes a network of uniform, fine particles that make up the "sol" part of the name.

Further processing of the "sol" enables one to make polymeric ceramic materials in different forms. A thin film can be produced on a substrate by spin-coating, dip-coating, or spray coating. A different viscosity may be desirable for each method of application. When applied to a surface, a wet "gel" will form. With drying and heat-treatment, the "gel" is converted into dense ceramic or glass-like state. The liquid in a wet "gel" is then removed under a supercritical condition, and a highly porous and extremely low density material called an "aerogel" is obtained. After the "gel" receives a second, higher-temperature curing operation, ceramic fibers are formed and bonded to each other and to the substrate.

The sol-gel layer can be applied to the first layer of the coatings using spray coating techniques that are widely used for organic paints and lacquers. The application of sol gel coatings to metallic or non-metallic surfaces is similar, although greater care is required to apply a thin film coating in the desired thickness range with close tolerance control. Typical non-stick coating thickness on cutting blades will be between 5 and 50 microns depending on the end use and desired performance characteristics.

The application of non-stick coatings by spraying offers several advantages compared to the spin- or dip-coating techniques, since processing speeds of 30 blades per minute are already achievable (up to 10 times faster than other methods), the waste of coating sols is much smaller, coatings can be made with sols having rather short pot lives, and the coating step is suitable for establishing an in-line process.

More details regarding methods for depositing the coatings are provided in the Examples, below.

EXAMPLES

Coatings were deposited on stainless steel scissors blades with three surface roughness values via PVD. The machine finish scissors blades in the original shape were composed of 420 hardened stainless steel. In addition, factory prepared blades sand blasted to a minimum surface roughness were coated. Finally, an additional set of blades with higher surface roughness were coated. Eight different compositions of titanium chromium nitride or titanium chromium carbide coatings were deposited on the blades via PVD and the coatings were characterized for chemical composition, hardness, and wear resistance. In addition, the PVD coated blades of each composition, with 2 blades for each coating and for each surface finish, were coated with a polymer. A set of blades of each surface roughness without the PVD coating were also coated with the polymer.

Characterization of the Surface Roughness of the 3 Sets of Blades:

The surface roughness (R) of the as machined blades, factory sand blasted blades with minimum surface roughness, and sand blasted blades having a higher roughness were characterized by surface profiling with a profilameter. The results are shown in Table 1.

TABLE 1

| Surface finish | $R_{maximum}$ (microns) | $R_{minimum}$ (microns) | $R_{average}$ (microns) |
| --- | --- | --- | --- |
| Roughest | 1.5 | 3.0 | 0.94 |
| Smoothest | 1.65 | 1.5 | 0.64 |
| Machine Finish | 1.0 | 1.0 | 0.4 |

Although, the average surface roughness was smaller for the machine finished blades, these blades had more machining marks and the depth and width of the sand blasted regions were lower for the "smoothest" blades.

Preparation of the Samples for PVD Coatings:

Two blades for each surface roughness shown in Table 1 were cleaned in acetone to remove the oily surfaces and cleaned further in mild detergent soap. The samples were further etched in very dilute acid (2% HCl and 10% HNO$_3$) for 5 seconds. Two cut blade samples of smaller size (5 mm×5 mm) for each surface roughness were also prepared following the same procedure. These smaller samples were coated for measurement of hardness and wear resistance. Two silicon polished wafers were also cleaned with dilute acid (49% HF). These silicon samples were PVD coated under the same conditions and were used for the nanohardness measurements of the coatings. The silicon wafers allow for a significantly smooth substrate, which allows for more accurate nanoindentation hardness values. Due to the size of the indenter, a relatively rough surface would cause an unsuitable angle of indentation incidence, which in turn affects the hardness data obtained by nanoindentation. Accurate hardness measurements are obtained through nanoindentation procedures regardless of the substrate so long as the substrate has a substantially smooth surface, as the indenter does not penetrate through the coating into the substrate. Nanoindentation allows for data to be obtained for the coating irrespective of the substrate, therefore the use of silicon wafers rather than steel substrates does not affect the testing data obtained. The use of polished silicon wafers as a coating substrate is an accepted procedure for accurate nanoindentation coating tests.

Deposition of the PVD Coatings:

Deposition of the coatings was performed using reactive magnetron sputtering with a pulsed dc source. A 4-inch circular target was used with a pulsed DC power supply. The targets were made by using a combination of titanium and chromium targets in a combination of 60° and 90° sector angles.

The compositions of the sputtering targets were the same as the desired coating compositions. Thus, the compositions of the targets used to deposit the eight coatings were 100% Cr for CrC, 100% Ti for TiC, 75% Ti and 25% Cr for carbide, 50% Ti and 50% Cr for carbide or nitride, 30% Ti and 70% Cr for carbide or nitride, and 40% Ti and 60% Cr for carbide. Where the listed percentages are in wt. %.

The sputtering gas mixture was argon and nitrogen for the nitride coatings and argon and methane for the carbide coatings. The partial pressure of argon was maintained between 0 to 1 millitorr and that of nitrogen was kept at 1 to 2 millitorr with the total sputtering gas pressure remaining between 2 to 3 millitorr for deposition of the nitrides. Similarly, the partial pressure of argon was maintained between 0 to 1 millitorr and that of methane was kept at 1 to 2 millitorr with the total sputtering gas pressure remaining between 2 to 3 millitorr for deposition of the carbides. The stainless steel chamber was evacuated to 5×10$^{-6}$ Torr prior to the deposition. Cleaning of the target was carried out with argon alone. Other partial pressures and sputtering gases can be used. For example, it is contemplated that the methane percentage can range from about 0% to about 100% and the nitrogen percentage can range from about 100% to about 0% in the sputtering gas mixture. It is further contemplated that the gas mixture can include a gas other than nitrogen and methane. For example, acetylene gas (C$_2$H$_2$) can replace methane as a carbon source or ammonia gas (NH$_3$) can replace nitrogen gas as the nitrogen source.

The sputtering current was kept at 0.3 amps during cleaning, which was carried out for 5 minutes in all depositions. The sputtering current was 1 amp during the deposition of the coatings. Depositions were performed for 30 minutes. The resulting thickness of the carbide and nitride layers was found to be 0.5 µm+/−0.1 µm.

The deposition temperature was kept at 200° C. so that the stainless steel scissor blades would not soften during the deposition of the carbide and/or nitride layers. All the samples (2 long blades for each surface roughness, 2 small cut blades for each surface roughness and 2 silicon single crystal substrates) were kept on the sample holder during the deposition process.

Deposition of a Sol-Gel Layer:

A silica sol gel comprising a network of Si—O—Si (siloxane) bonds was applied to the top of the carbide layer using a spray deposition technique.

Characterization:

The characterization of the coatings was performed using different methods, as described in greater detail, below. Table 2 shows the coating layer and substrate used for each characterization method.

TABLE 2

| Characterization | Layer analyzed | Samples used |
|---|---|---|
| SEM-EDS-Chemical analysis | PVD coating (First Layer) | Coating on Si |
| Hardness VPN | PVD coating (First Layer) | Coating on blades of 5 mm × 5 mm Factory surface finish |
| Nanoindentation | PVD coating (First Layer) | Coating on Si |
| Wear resistance | PVD coating (First Layer) | Coating on blades of 5 mm × 5 mm Factory surface finish |
| Scratch adhesion | Polymer coating (Second Layer) | Coating on blades 3 inch length and 3 surface finishes |

Chemical analysis of the first layer of the coatings was performed via scanning electron microscopy (SEM) and energy dispersive X-ray spectroscopy (EDX). The spectrum for each sample was taken and the elemental peaks were analyzed. In all the samples, the titanium peak was smaller than expected based on the target composition. This discrepancy could arise from lower X-ray signals that arise from titanium compared to those from chromium. It could also arise when silicon is used as a substrate. A correction factor was applied to the titanium peak in order to compare with the chromium peak. This correction factor is described as follows. The chromium peak is 30.8 counts for a carbon peak of 4.8 counts in 100% CrC. Also, the titanium peak is 11.3 counts when the carbon peak is 5.4 counts. The peak height for Ti in 100% TiC should be equivalent to that of Cr in 100% CrC. However, Ti peak is smaller by a factor of 3.0. To correct for this effect, the Ti peak height was multiplied by a factor of 3.0. The compositions of the carbide and nitride layers were determined from the adjusted Ti and Cr peaks. The compositions selected for this experiment are reported in Table 3, along with the color of the layers.

Microhardness of the PVD coated small blades (5 mm×5 mm) was measured using a microhardness test with a diamond pyramid. In this test, a diamond pyramid with a standard angle of 136° was used as an indenter. The magnitude of the load was 50 gms. This load was applied on the indenter so that reasonable indentation marks could be observed. Diamond pyramid hardness (DPH) or the Vickers hardness is given by $DPH=2P \sin(68)/d^2$ where P is the load and d is the average size of the diagonal of the square indentation obtained after the indenter penetrates the coating layer. In general, d is the average of the two values of the diagonals of the rectangular indentation obtained. The average values are used, as a square indentation is very rarely obtained. The hardness measurements follow the procedure provided in ASTM Standard Test Method for microhardness of materials ASTM E384 (03.01). Vickers hardness from the ASTM standards is given in units of gms/mm² because P is in grams and d is in millimeters. P is provided in kilograms and d in meters so that the hardness could be measured in units of gigapascals (GPa). Table 4 provides the hardness of each sample for a load P=50 gms.

Hardness and elastic modulus values were obtained by nanoindentation testing of the nitride and carbide layers deposited on a polished silicon substrate. The results are provided in Table 5. A load of 2500 µN was used in the nanoindentation test and three tests are performed for each sample coating. A Hysitron Triboindentor model TI-900 was used. This instrument has a strain measurement with a sensor built into the transducer, a piezoelectric loading device with three electrostatically controlled parallel beams, and an attached atomic force microscope to view indention markings.

The adhesion of the polymer layer of the coating to the PVD layer of the coating and to the uncoated blade samples were tested for samples with the three different roughness values. The testing was carried out according to ASTM D7027-05 and ASTM C1624. In this test, a normal load was applied on a 1 mm diameter hardened steel pin scratch indenter that moved on the surface of the polymer layer. Peeling of the polymer layer along the scratch was detected above a certain normal load. The normal load at which scratch was observed was converted to a tangential load based on the relationship: (tangential load)=(coefficient of friction×normal load). The coefficient of friction was determined separately and found to be 0.3. The tangential load at which the scratch was made was used as the shear strength of adhesion of the polymer to the blades. Table 6 gives the values of the tangential loads at which the polymer peeled from the surface of the blades for blade surfaces have three different roughness values.

An axial pull test was also used to characterized the second layer of the coatings. This test was the pull off test according to ASTM D4541 and ASTM 633. In this test, a brass connecting rod was attached to each side of a test coupon using an industrial strength epoxy adhesive, taking care to align the two rods in such a way that an imaginary straight center line ran through them. Then the pull-off force was measured on a tensilometer. It was intended for the non-stick to come off with one of the rods. However, the non-stick property of the layer made measurement of the removal force impossible. Adhesives bonded preferentially to the brass rod and came off the surface coating with very low force, too low to be measurable.

The second layer of the coatings were further tested using a test method called an "indentation cracking test". The test was carried out in accordance with ASTM E2546. The procedure here was to press a pyramidal four-sided indenter into the non-stick coating at a known force, remove the force, and observe the indentation under magnification. The polymer film was observed to be very ductile under magnification. It did not crack or show any measurable indentation marking even at high loads.

Wear resistance was measured according to ASTM G99-95a using either a pin or ball on disc samples. In this test a fixed normal load was applied on the steel ball in contact with the PVD layer. Wear resistance was measured by rotating (rubbing) the steel ball of diameter 1.5 cm on the disc. No wear was observed for a load of 10 gms or higher applied on the ball. Therefore a diamond paste having 0.1 µm size particles was used as an abrasive between the ball and the disc samples. The wear test was performed for 1 minute and the wear track size (diameter) was determined at the end of the wear. Wear volume was calculated from the diameter of the ball and the diameter of the wear track. The results of the wear resistance tests (wear rates) are provided in Table 7.

TABLE 3

| Sample Set # | Ti (wt. %) | Cr (wt. %) | C (wt. %) | N (wt. %) | Formula of Layer | Color |
| --- | --- | --- | --- | --- | --- | --- |
| 1 | 100 | 0 | 100 | | TiC | Gray |
| 2 | 0 | 100 | 100 | | CrC | Silver |
| 3 | 72 | 28 | 100 | | $Ti_{0.7}Cr_{0.3}C$ | Silver |
| 4 | 50 | 50 | 100 | | $Ti_{0.5}Cr_{0.5}C$ | Gray |
| 5 | 48 | 52 | | 100 | $Ti_{0.5}Cr_{0.5}N$ | Silver |
| 6 | 32 | 68 | | 100 | $Ti_{0.3}Cr_{0.7}N$ | Silver |
| 7 | 40 | 60 | 100 | | $Ti_{0.4}Cr_{0.6}C$ | Gray |
| 8 | 30 | 70 | 100 | | $Ti_{0.3}Cr_{0.7}C$ | Silver |
| 9 | 0 | 0 | 0 | 0 | None | |

TABLE 4

| Sample Set # | Ti (wt. %) | Cr (wt. %) | C (wt. %) | N (wt. %) | Formula of Layer | Color | VPN (GPa) |
| --- | --- | --- | --- | --- | --- | --- | --- |
| 1 | 100 | 0 | 100 | | TiC | Gray | 4.33 |
| 2 | 0 | 100 | 100 | | CrC | Silver | 3.03 |
| 3 | 72 | 28 | 100 | | $Ti_{0.7}Cr_{0.3}C$ | Silver | 3.51 |
| 4 | 50 | 50 | 100 | | $Ti_{0.5}Cr_{0.5}C$ | Gray | 4.55 |
| 5 | 48 | 52 | | 100 | $Ti_{0.5}Cr_{0.5}N$ | Silver | 4.03 |
| 6 | 32 | 68 | | 100 | $Ti_{0.3}Cr_{0.7}N$ | Silver | 3.76 |
| 7 | 40 | 60 | 100 | | $Ti_{0.4}Cr_{0.6}C$ | Gray | 4.22 |
| 8 | 30 | 70 | 100 | | $Ti_{0.3}Cr_{0.7}C$ | Silver | 4.55 |
| 9 | 0 | 0 | 0 | 0 | None | | — |

TABLE 5

| Sample Set # | Ti (wt. %) | Cr (wt. %) | C (wt. %) | N (wt. %) | Formula of Layer | Color | Nanoindentation Hardness (GPa) | Elastic Modulus (GPa) |
| --- | --- | --- | --- | --- | --- | --- | --- | --- |
| 1 | 100 | 0 | 100 | | TiC | Gray | 8.7 | 97 |
| 2 | 0 | 100 | 100 | | CrC | Silver | 14.6 | 208 |
| 3 | 72 | 28 | 100 | | $Ti_{0.7}Cr_{0.3}C$ | Silver | 9.0 | 142.5 |
| 4 | 50 | 50 | 100 | | $Ti_{0.5}Cr_{0.5}C$ | Gray | 13.04 | 171 |
| 5 | 48 | 52 | | 100 | $Ti_{0.5}Cr_{0.5}N$ | Silver | 23.3 | 242 |

TABLE 5-continued

| Sample Set # | Ti (wt. %) | Cr (wt. %) | C (wt. %) | N (wt. %) | Formula of Layer | Color | Nanoindentation Hardness (GPa) | Elastic Modulus (GPa) |
|---|---|---|---|---|---|---|---|---|
| 6 | 32 | 68 | | 100 | $Ti_{0.3}Cr_{0.7}N$ | Silver | 24.1 | 211 |
| 7 | 40 | 60 | 100 | | $Ti_{0.4}Cr_{0.6}C$ | Gray | 14.6 | 163 |
| 8 | 30 | 70 | 100 | | $Ti_{0.3}Cr_{0.7}C$ | Silver | 12.3 | 169 |
| 9 | 0 | 0 | 0 | 0 | None | | — | |

TABLE 6

| Sample Set # | Ti (wt. %) | Cr (wt. %) | C (wt. %) | N (wt. %) | Formula of Layer | Color | Tangential (scratch adhesion stress) (MPa) |
|---|---|---|---|---|---|---|---|
| 1 | 100 | 0 | 100 | | TiC | Gray | 0.87 |
| | | | | | | | 0.99 |
| | | | | | | | 0.74 |
| 2 | 0 | 100 | 100 | | CrC | Silver | 0.91 |
| | | | | | | | 0.99 |
| | | | | | | | 0.74 |
| 3 | 72 | 28 | 100 | | $Ti_{0.7}Cr_{0.3}C$ | Silver | 0.83 |
| | | | | | | | 0.99 |
| | | | | | | | 0.60 |
| 4 | 50 | 50 | 100 | | $Ti_{0.5}Cr_{0.5}C$ | Gray | 0.91 |
| | | | | | | | 1.03 |
| | | | | | | | 0.74 |
| 5 | 48 | 52 | | 100 | $Ti_{0.5}Cr_{0.5}N$ | Silver | 0.87 |
| | | | | | | | 1.07 |
| | | | | | | | 0.83 |
| 6 | 32 | 68 | | 100 | $Ti_{0.3}Cr_{0.7}N$ | Silver | 0.83 |
| | | | | | | | 1.01 |
| | | | | | | | 0.78 |
| 7 | 40 | 60 | 100 | | $Ti_{0.4}Cr_{0.6}C$ | Gray | 0.91 |
| | | | | | | | 0.95 |
| | | | | | | | 0.78 |
| 8 | 30 | 70 | 100 | | $Ti_{0.3}Cr_{0.7}C$ | Silver | 0.95 |
| | | | | | | | 0.95 |
| | | | | | | | 0.78 |
| 9 | 0 | 0 | 0 | 0 | None | | 0.87 |
| | | | | | | | 0.91 |
| | | | | | | | 0.83 |

TABLE 7

| Sample Set # | Ti (wt. %) | Cr (wt. %) | C (wt. %) | N (wt. %) | Formula of Layer | Color | Wear Rate (cubicmicrons/min) |
|---|---|---|---|---|---|---|---|
| 1 | 100 | 0 | 100 | | TiC | Gray | 48 |
| 2 | 0 | 100 | 100 | | CrC | Silver | 105 |
| 3 | 72 | 28 | 100 | | $Ti_{0.7}Cr_{0.3}C$ | Silver | 22 |
| 4 | 50 | 50 | 100 | | $Ti_{0.5}Cr_{0.5}C$ | Gray | 93 |
| 5 | 48 | 52 | | 100 | $Ti_{0.5}Cr_{0.5}N$ | Silver | 105 |
| 6 | 32 | 68 | | 100 | $Ti_{0.3}Cr_{0.7}N$ | Silver | 88 |
| 7 | 40 | 60 | 100 | | $Ti_{0.4}Cr_{0.6}C$ | Gray | 73 |
| 8 | 30 | 70 | 100 | | $Ti_{0.3}Cr_{0.7}C$ | Silver | 28 |
| 9 | 0 | 0 | 0 | 0 | None | | — |

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A coated cutting implement comprising:
   a cutting implement having a cutting edge; and
   a coating disposed on the cutting edge, the coating comprising:
   a first layer in contact with the cutting edge, the first layer comprising metal carbides, the metal carbides containing titanium and chromium in a weight ratio in the range of 30:70 to 72:28 Ti:Cr; and
   a non-stick layer in contact with and formed over the first layer, the non-stick layer including an organic polymer comprising a polysiloxane and being free of fluoride.

2. The implement of claim 1, wherein the first layer comprises titanium carbide and chromium carbide in a weight ratio in the range of 40:60 to 50:50 Ti:Cr.

3. The implement of claim 1, wherein the first layer comprises about 40 to 50 weight percent titanium carbide and about 50 to 60 weight percent chromium carbide, based on the total weight of the first layer.

4. The implement of claim 1, wherein the first layer forms a metallurgical bond with the cutting edge.

5. The implement of claim 1, wherein the cutting implement is scissors.

6. The implement of claim 1, wherein the cutting implement comprises stainless steel.

7. The implement of claim 1, wherein the first layer has a nanoindentation hardness of at least 10 GPa, as measured on a polished silicon wafer.

8. The implement of claim 1, wherein the first layer has a nanoindentation hardness of at least 25 GPa, as measured on a polished silicon wafer.

9. The implement of claim 1, wherein the first layer is silver, grey or charcoal in appearance.

10. The implement of claim 1, wherein the implement is selected from the group consisting of knives, rotary style paper trimmers, and guillotine style paper trimmers.

11. The implement of claim 1, wherein the first layer is a PVD coating.

12. The implement of claim 6, wherein the cutting implement comprises stainless steel.

13. The implement of claim 1, wherein the non-stick layer has a thickness between 5 and 50 microns.

14. The implement of claim 1, wherein the first layer has a wear resistance of no greater than 70 micron$^3$/minute as measured according to ASTM G99-95a.

15. The implement of claim 1, wherein the first layer has a wear resistance of no greater than 30 micron$^3$/minute as measured according to ASTM G99-95a.

16. The implement of claim 1, wherein the non-stick layer has a tangential scratch adhesion stress in accordance with ASTM D7027-05 and ASTM C1624 in the range of 0.74-1.03 MPa.

* * * * *